(12) United States Patent
Iida et al.

(10) Patent No.: US 11,688,553 B2
(45) Date of Patent: Jun. 27, 2023

(54) MULTILAYER COIL AND METHOD FOR MANUFACTURING THE SAME

(71) Applicant: Murata Manufacturing Co., Ltd., Nagaokakyo (JP)

(72) Inventors: Kanto Iida, Nagaokakyo (JP); Naoki Gouchi, Nagaokakyo (JP); Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 975 days.

(21) Appl. No.: 16/257,156

(22) Filed: Jan. 25, 2019

(65) Prior Publication Data
US 2019/0157001 A1  May 23, 2019

Related U.S. Application Data

(63) Continuation of application No. PCT/JP2017/028206, filed on Aug. 3, 2017.

(30) Foreign Application Priority Data

Aug. 18, 2016  (JP) .................. 2016-160540

(51) Int. Cl.
*H05K 1/00* (2006.01)
*H05K 1/03* (2006.01)
(Continued)

(52) U.S. Cl.
CPC .......... *H01F 41/042* (2013.01); *C09K 19/38* (2013.01); *H01F 5/003* (2013.01); *H01F 17/02* (2013.01);
(Continued)

(58) Field of Classification Search
CPC .. H05K 3/00; H05K 3/03; H05K 3/30; H05K 3/36; H05K 3/46; H05K 3/388;
(Continued)

(56) References Cited

U.S. PATENT DOCUMENTS 8,254,144 B2 *  8/2012  Matsumoto .......... H05K 1/0224
                                                    361/803
9,986,640 B2 *  5/2018  Yang .................. H01F 17/0013
(Continued)

FOREIGN PATENT DOCUMENTS

JP    61-124117 A      6/1986
JP    02079208 A  *   3/1990  .......... G11B 5/3163
(Continued)

OTHER PUBLICATIONS

Official Communication issued in International Patent Application No. PCT/JP2017/028206, dated Oct. 24, 2017.

*Primary Examiner* — Xiaoliang Chen
(74) *Attorney, Agent, or Firm* — Keating & Bennett, LLP

(57) ABSTRACT

A method for manufacturing a multilayer coil includes preparing a first substrate by forming a first conductor pattern on a first insulating base material layer, preparing a second substrate by forming a second conductor pattern on a second insulating base material layer, and joining a surface of the first substrate on which the first conductor pattern is formed and a surface of the second substrate on which the second conductor pattern is formed together with only a joining layer made of a thermoplastic resin interposed therebetween. Amounts of deformation of the first and second insulating base material layers are less than that of the joining layer at a fusion temperature. The first and second conductor patterns are each a coil pattern having a coil axis that extends in a lamination direction in which the first substrate and the second substrate are laminated together.

9 Claims, 9 Drawing Sheets

(51) Int. Cl.
- *H05K 1/09* (2006.01)
- *H05K 1/11* (2006.01)
- *H05K 1/16* (2006.01)
- *H05K 1/18* (2006.01)
- *H05K 3/00* (2006.01)
- *H05K 3/30* (2006.01)
- *H05K 3/36* (2006.01)
- *H05K 3/46* (2006.01)
- *H01F 5/00* (2006.01)
- *H01F 17/00* (2006.01)
- *H01F 17/06* (2006.01)
- *H01F 41/04* (2006.01)
- *H04R 9/02* (2006.01)
- *H04R 9/06* (2006.01)
- *H01F 17/02* (2006.01)
- *C09K 19/38* (2006.01)
- *H05K 1/02* (2006.01)

(52) U.S. Cl.
CPC .......... *H05K 1/024* (2013.01); *H05K 3/4652* (2013.01); *H01F 2005/006* (2013.01); *H05K 2201/0141* (2013.01); *H05K 2201/0195* (2013.01); *H05K 2203/0502* (2013.01)

(58) Field of Classification Search
CPC . H05K 3/429; H05K 1/09; H05K 1/11; H05K 1/16; H05K 1/18; H05K 1/113; H05K 1/116; H05K 1/165; H05K 1/185; H01F 5/00; H01F 17/00; H01F 17/0013; H01F 17/0006; H01F 41/04; H01F 41/041; H01F 5/003; H04R 9/02; H04R 9/06
USPC .............. 336/200, 192; 361/728, 763, 803; 174/250, 257, 258, 260, 262, 264
See application file for complete search history.

(56) References Cited

U.S. PATENT DOCUMENTS

| | | | |
|---|---|---|---|
| 2006/0054628 A1* | 3/2006 | Matsuoka | F17C 1/06 220/581 |
| 2006/0145805 A1* | 7/2006 | Kim | H01F 5/00 336/200 |
| 2006/0180344 A1* | 8/2006 | Ito | H05K 3/4602 174/262 |
| 2006/0191133 A1* | 8/2006 | Nakao | H05K 3/4617 29/831 |
| 2011/0083883 A1* | 4/2011 | Yugawa | H05K 3/388 174/256 |
| 2011/0100691 A1* | 5/2011 | Yugawa | H05K 3/388 174/260 |
| 2012/0306608 A1* | 12/2012 | Takenaka | H05K 3/30 336/200 |
| 2013/0074321 A1* | 3/2013 | Yoon | H01F 41/041 29/602.1 |
| 2013/0223033 A1* | 8/2013 | Mano | H05K 1/18 361/763 |
| 2013/0342301 A1* | 12/2013 | Mano | H01F 27/24 336/200 |
| 2014/0034373 A1* | 2/2014 | Yoshikawa | H05K 1/165 174/260 |
| 2015/0077209 A1* | 3/2015 | Fujii | C25D 5/10 336/200 |
| 2015/0116950 A1* | 4/2015 | Yoo | H05K 1/185 361/728 |
| 2016/0236402 A1* | 8/2016 | Nakashima | H05K 3/4644 |
| 2018/0295451 A1* | 10/2018 | Min | H05K 3/4614 |
| 2020/0395803 A1* | 12/2020 | Ito | H02K 41/031 |

FOREIGN PATENT DOCUMENTS

| | | |
|---|---|---|
| JP | 07-335443 A | 12/1995 |
| JP | 2000-091138 A | 3/2000 |
| JP | 2004-095860 A | 3/2004 |
| JP | 2012-089700 A | 5/2012 |

\* cited by examiner

Fig. 2
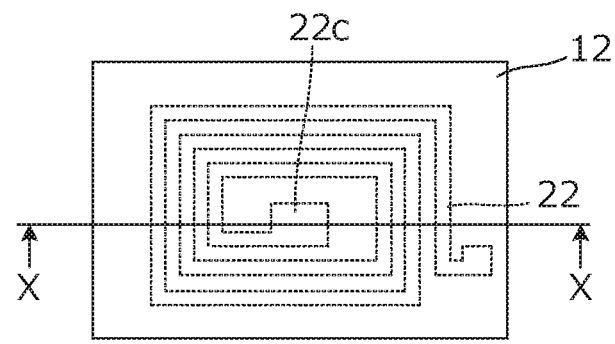
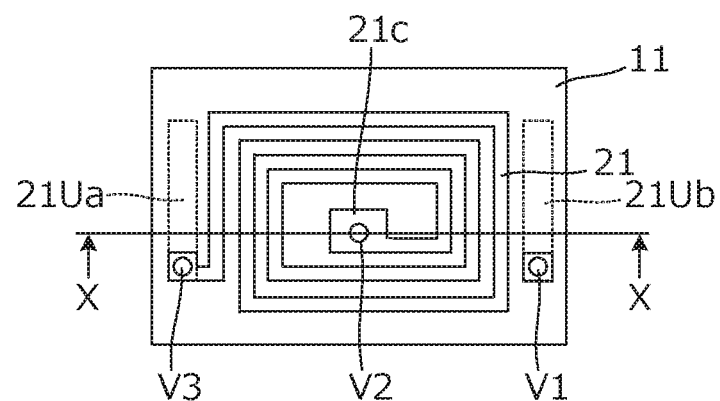

Fig. 5
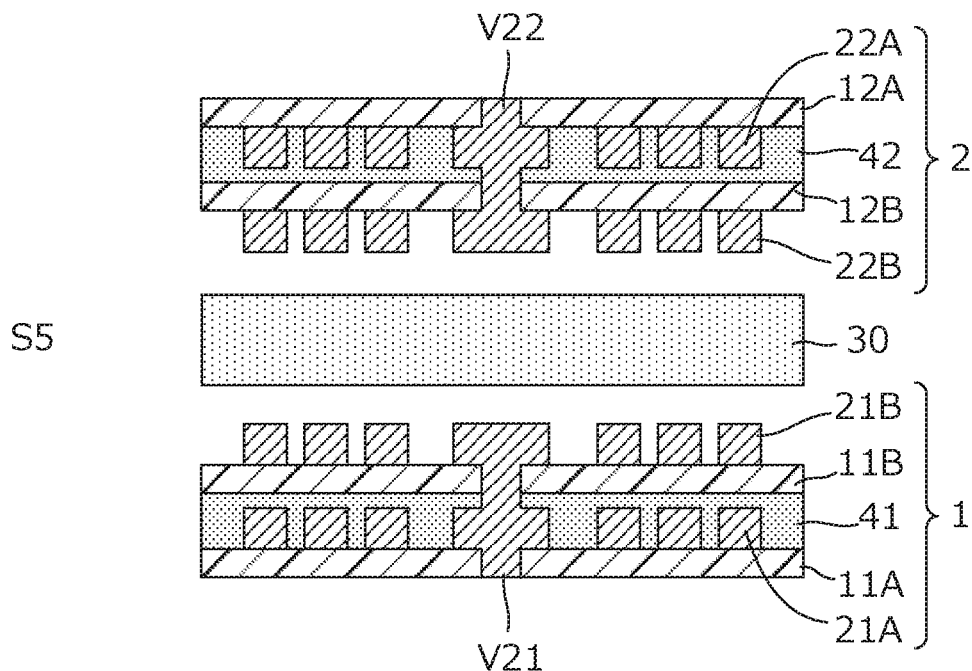
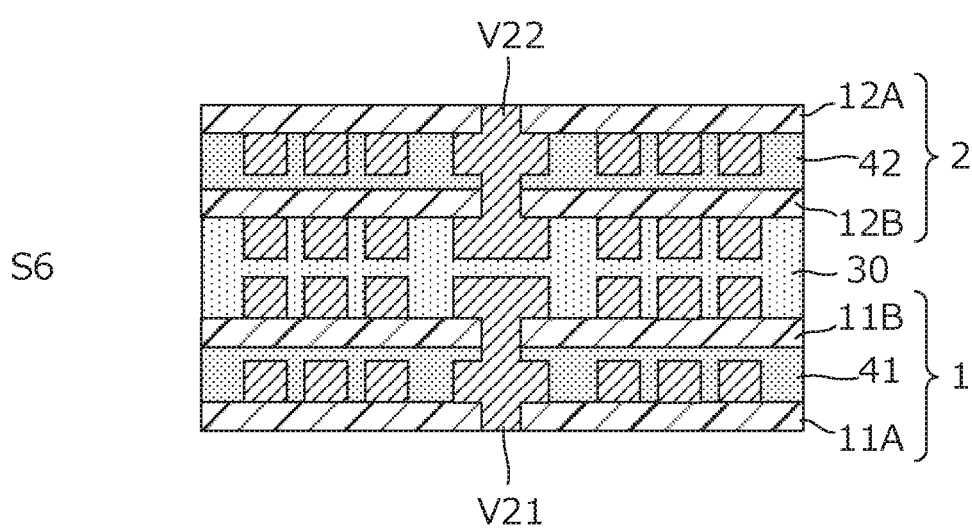

MULTILAYER COIL AND METHOD FOR MANUFACTURING THE SAME

CROSS REFERENCE TO RELATED APPLICATIONS

This application claims the benefit of priority to Japanese Patent Application No. 2016-160540 filed on Aug. 18, 2016 and is a Continuation Application of PCT Application No. PCT/JP2017/028206 filed on Aug. 3, 2017. The entire contents of each application are hereby incorporated herein by reference.

BACKGROUND OF THE INVENTION

1. Field of the Invention

The present invention relates to a multilayer coil obtained by laminating insulating base material layers on which conductor patterns are provided, and to a method for manufacturing the multilayer coil.

2. Description of the Related Art

Japanese Unexamined Patent Application Publication No. 2012-89700, for example, describes a thin planar coil obtained by laminating two substrates having coil patterns formed therein. The planar coil includes a structure in which a first substrate and a second substrate are bonded together with an inner insulating layer interposed therebetween. The first substrate includes a resin layer in which a first coil pattern is embedded, and the second substrate includes a resin layer in which a second coil pattern is embedded.

A multilayer coil obtained by laminating two substrates which each have a coil pattern formed thereon may have a structure (first structure) in which the coil pattern of one substrate faces an insulating base material of the other substrate or a structure (second structure) in which the coil patterns of the substrates face each other. FIG. 8 is a sectional view of a multilayer coil having the first structure before lamination, and FIG. 9 is a sectional view of a multilayer coil having the second structure before lamination.

The first structure illustrated in FIG. 8 includes insulating base materials 11 and 12 supporting conductor patterns 21 and 22. When the insulating base materials 11 and 12 are deformed, the conductor patterns 21 and 22 are also deformed and the electrical characteristics are changed. The second structure illustrated in FIG. 9 includes an insulating base material 11 having a conductor pattern 21 formed thereon, an insulating base material 12 having a conductor pattern 22 formed thereon, and a thermosetting resin layer (prepreg layer) 40 through which the insulating base materials 11 and 12 are bonded to each other. It is, however, difficult to flow thermosetting resin between the conductor patterns having a small pitch. In addition, when slurry thermosetting resin is used, hollow spaces (voids) are easily formed due to deformation during the thermosetting process performed after the inflow.

SUMMARY OF THE INVENTION

Preferred embodiments of the present invention provide multilayer coils that are each free from the problems of deformation of conductor patterns and hollow spaces between the conductor patterns.

According to a preferred embodiment the present invention, a method for manufacturing a multilayer coil includes a step of preparing a first substrate by forming a first conductor pattern on a first insulating base material layer; a step of preparing a second substrate by forming a second conductor pattern on a second insulating base material layer; a step of joining a surface of the first substrate on which the first conductor pattern is formed and a surface of the second substrate on which the second conductor pattern is formed together with only a joining layer made of a thermoplastic resin interposed therebetween; and a step of forming a hole through the first insulating base material layer and the second insulating base material layer after the step of joining so that a portion of the first conductor pattern and a portion of the second conductor pattern are exposed on the hole, and forming a conductor on the hole to electrically connect the first conductor pattern and the second conductor pattern to each other. Amounts of deformation of the first insulating base material layer and the second insulating base material layer at a fusion temperature of the joining layer are less than an amount of deformation of the joining layer at the fusion temperature of the joining layer. The first conductor pattern and the second conductor pattern are each a coil pattern having a coil axis that extends in a lamination direction in which the first substrate and the second substrate are laminated together.

According to the above-described manufacturing method, a multilayer coil in which the amounts of deformation of the first and second conductor patterns are small and in which hollow spaces are not easily formed between portions of the first conductor pattern and between portions of the second conductor pattern is able to be obtained.

According to a preferred embodiment of the present invention, in the method for manufacturing the multilayer coil, at least one of the first conductor pattern and the second conductor pattern is a spiral coil.

According to a preferred embodiment of the present invention, in the method for manufacturing the multilayer coil, at least one of the first conductor pattern and the second conductor pattern is formed by plating.

According to a preferred embodiment of the present invention, in the method for manufacturing the multilayer coil, the first conductor pattern has a thickness greater than a thickness of the first insulating base material layer, and the second conductor pattern has a thickness greater than a thickness of the second insulating base material layer. Alternatively, the thickness of the first conductor pattern is greater than the thickness of the first insulating base material layer.

According to a preferred embodiment of the present invention, a multilayer coil includes a first substrate including a first insulating base material layer and a first conductor pattern provided on the first insulating base material layer; a second substrate including a second insulating base material layer and a second conductor pattern provided on the second insulating base material layer; a joining layer that joins the first insulating base material layer and the second insulating base material layer together in a laminated state; a hole extending through the first insulating base material layer and the second insulating base material layer; and a conductor provided on the hole, and electrically connecting a portion of the first conductor pattern and a portion of the second conductor pattern to each other. The joining layer is made of a thermoplastic resin. Amounts of deformation of materials of the first insulating base material layer and the second insulating base material layer at a fusion temperature of the joining layer are less than an amount of deformation of the joining layer at the fusion temperature of the joining layer. The first conductor pattern and the second conductor pattern are each a coil pattern having a coil axis that extends in a lamination direction in which the first substrate and the second substrate are laminated together. The joining layer is a single layer. The multilayer coil includes a portion in which only the joining layer is interposed between the first conductor pattern and the second conductor pattern.

According to the above-described structure, a multilayer coil in which the amounts of deformation of the first and second conductor patterns are small and in which hollow spaces do not occur between portions of the first conductor pattern and between portions of the second conductor pattern is able to be obtained.

According to a preferred embodiment of the present invention, in the multilayer coil, at least one of the first conductor pattern and the second conductor pattern is a spiral coil.

According to a preferred embodiment of the present invention, in the multilayer coil, at least one of the first conductor pattern and the second conductor pattern is defined by a plated pattern.

According to a preferred embodiment of the present invention, in the multilayer coil, the first conductor pattern has a thickness greater than a thickness of the first insulating base material layer and the second conductor pattern has a thickness greater than a thickness of the second insulating base material layer. Alternatively, the thickness of the first conductor pattern is greater than the thickness of the first insulating base material layer.

According to a preferred embodiment of the present invention, in the multilayer coil, at least one of the first conductor pattern and the second conductor pattern includes coil patterns in a plurality of layers. This provides a coil component that does not cause a large variation in characteristics due to deformation of conductor patterns, with the coil including the conductor patterns likely to be laminated with small gaps therebetween.

According to a preferred embodiment of the present invention, in the multilayer coil, the first conductor pattern includes a coil pattern on both sides of the first insulating base material layer. According to this structure, a coil component including coil patterns disposed in multiple layers is able to be easily obtained.

Preferred embodiments of the present invention provide multilayer coils each with small deformations of conductor patterns and small variations in characteristics due to hollow spaces between the conductor patterns.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 shows plan views of conductor patterns provided on insulating base material layers.

FIG. 5 shows sectional views illustrating manufacturing steps of the multilayer coil according to the second preferred embodiment of the present invention performed after the manufacturing steps illustrated in FIG. 4.

DETAILED DESCRIPTION OF THE PREFERRED EMBODIMENTS

Figure 1:
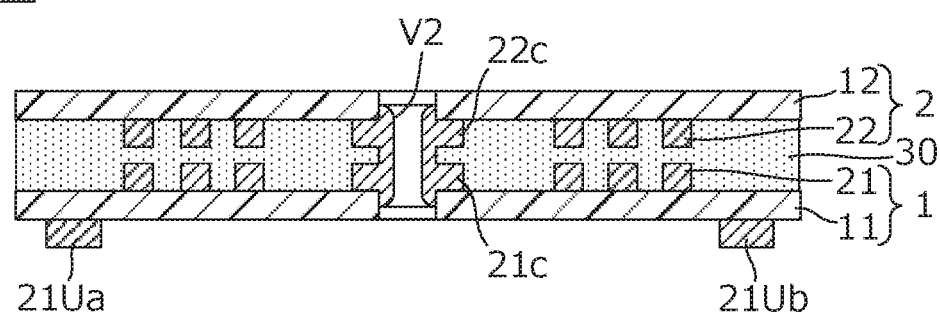
FIG. 1 is a sectional view of a multilayer coil according to a first preferred embodiment of the present invention.

Preferred embodiments of the present invention will be described with reference to the drawings by way of examples. In the drawings, the same or similar components are denoted by the same reference numerals. Although the preferred embodiments are individually described to facilitate description and understanding of the features, structures in different preferred embodiments may be partially replaced or combined. In the second and following preferred embodiments, description of features similar to those in the first preferred embodiment is omitted, and only the differences will be described. In particular, description of the same or similar advantageous effects obtained by the same or similar structures is not repeated in each preferred embodiment.

First Preferred Embodiment

Figure 3:
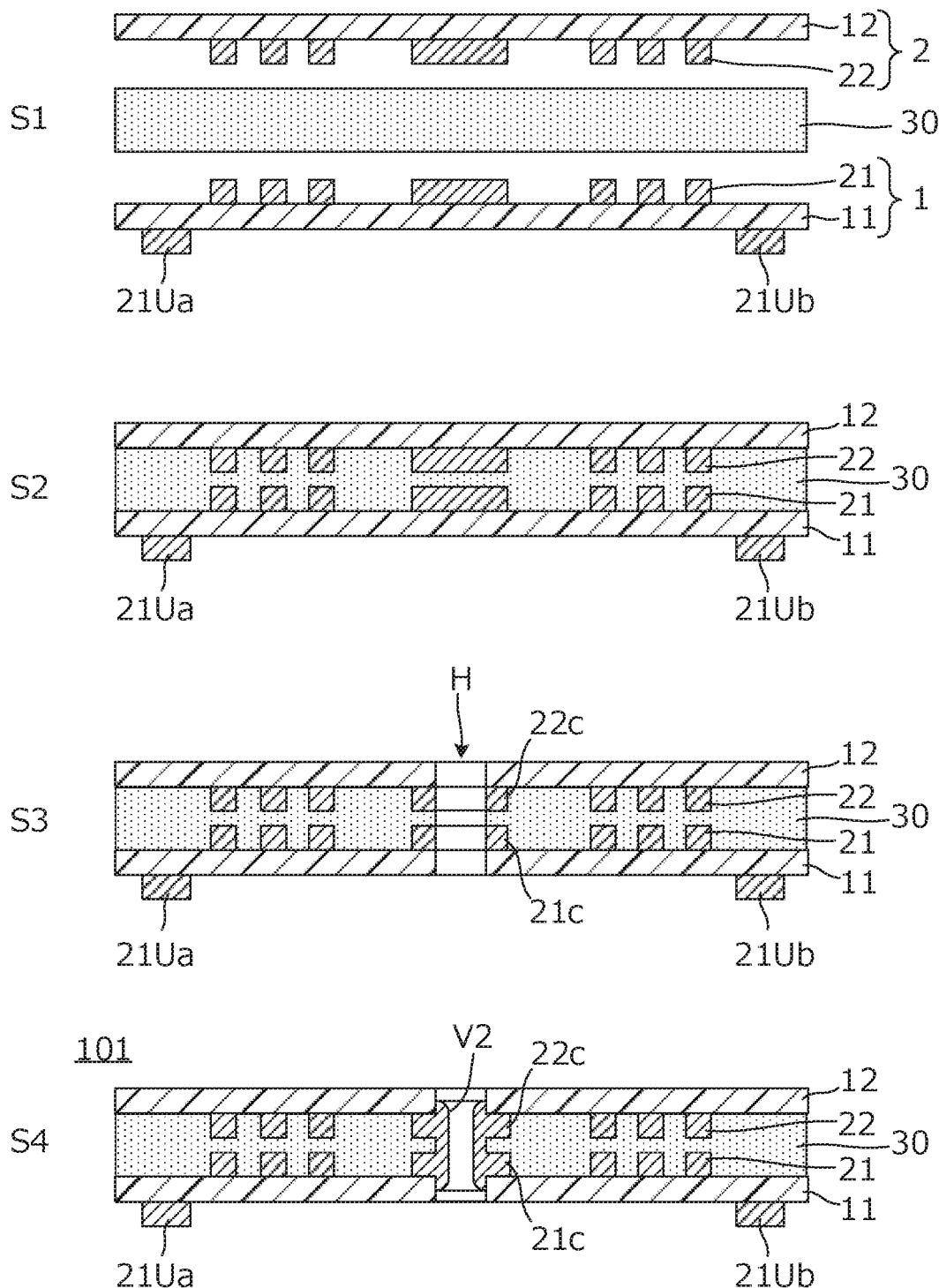
FIG. 3 shows sectional views illustrating manufacturing steps of the multilayer coil according to the first preferred embodiment of the present invention.

FIG. 1 is a sectional view of a multilayer coil 101 according to a first preferred embodiment of the present invention. FIG. 2 shows plan views of conductor patterns provided on insulating base material layers. FIG. 3 shows sectional views illustrating manufacturing steps of the multilayer coil 101 according to the first preferred embodiment. The sectional views shown in FIG. 3 are taken along lines X-X in FIG. 2.

The multilayer coil 101 includes a first substrate 1, a second substrate 2, and a joining layer 30. The first substrate 1 includes an insulating base material layer 11, a first conductor pattern 21 provided on an upper surface of the insulating base material layer 11, and conductor patterns 21Ua and 21Ub provided on a lower surface of the insulating base material layer 11 and defining and functioning as terminal electrodes. The second substrate 2 includes an insulating base material layer 12 and a second conductor pattern 22 provided on a lower surface of the insulating base material layer 12.

As illustrated in FIG. 2, the first conductor pattern 21 and the second conductor pattern 22 are each preferably spiral coil patterns having a coil axis extending in a lamination direction in which the first substrate 1 and the second substrate 2 are laminated together. An inner end 21c of the first conductor pattern 21 provided on the first insulating base material layer 11 and an inner end 22c of the second conductor pattern 22 provided on the second insulating base material layer 12 are electrically connected to each other by a via hole V2 including a plating film.

A via hole V1 that provides interlayer connection between the conductor pattern 21Ub on the lower surface and an outer end of the second conductor pattern 22 is provided in the insulating base material layer 11 and the joining layer 30. A via hole V3 that provides interlayer connection between the conductor pattern 21Ua on the lower surface and an outer end of the first conductor pattern 21 is provided in the insulating base material layer 11. The via hole V2 that provides interlayer connection between the inner end of the conductor pattern 21 and the inner end of the conductor pattern 22 is provided in the joining layer 30.

The multilayer coil 101 according to the present preferred embodiment is manufactured by the following example method.

The first substrate 1 is preferably formed by, for example, placing a Cu film on the first insulating base material 11 of an FR-4 type (Flame Retardant Type 4) and photolithographically patterning the Cu film. The second substrate 2 is similarly formed.

Referring to step S1 in FIG. 3, the first substrate 1 and the second substrate 2 are arranged so that the surface of the first substrate 1 on which the first conductor pattern 21 is formed and the surface of the second substrate 2 on which the second conductor pattern 22 is formed to face each other. The joining layer 30 is sandwiched between the first substrate 1 and the second substrate 2 to form a multilayer body. The joining layer 30 is preferably made of, for example, a thermoplastic resin, such as liquid crystal polymer (LCP).

The multilayer body is pressed and heated at, for example, about 280° C. Thus, referring to step S2 in FIG. 3, the first substrate 1 and the second substrate 2 are joined together with only the joining layer 30 interposed therebetween. This step corresponds to a "first step".

Amounts of deformation of the first insulating base material layer 11 and the second insulating base material layer 12 at the fusion temperature of the joining layer 30 are less than that of the joining layer 30.

A through hole H is formed in the multilayer body so that the inner end 21c of the first conductor pattern 21 formed on the first insulating base material layer 11 and the inner end 22c of the second conductor pattern 22 formed on the second insulating base material layer 12 are exposed. A Cu plating film, for example, is preferably formed on the exposed surfaces of the first conductor pattern 21 and the second conductor pattern 22. Thus, the first conductor pattern 21 and the second conductor pattern 22 are electrically connected to each other by the via hole V2. This step corresponds to a "second step". Although not illustrated in FIG. 3, via holes V1 and V3 are similarly formed.

According to the present preferred embodiment, only one joining layer 30 made of a thermoplastic resin is disposed between the two conductor patterns 21 and 22, and the amounts of deformation of the two insulating base material layers 11 and 12 at the fusion temperature of the joining layer 30 are less than that of the joining layer 30. Therefore, a multilayer coil in which amounts of deformation of the first conductor pattern 21 and the second conductor pattern 22 are small and in which hollow spaces are not easily formed between portions of the first conductor pattern 21 and between portions of the second conductor pattern 22 is able to be obtained.

Second Preferred Embodiment

In a second preferred embodiment of the present invention, first and second conductor patterns are both formed as coil patterns in a plurality of layers.

Figure 4:
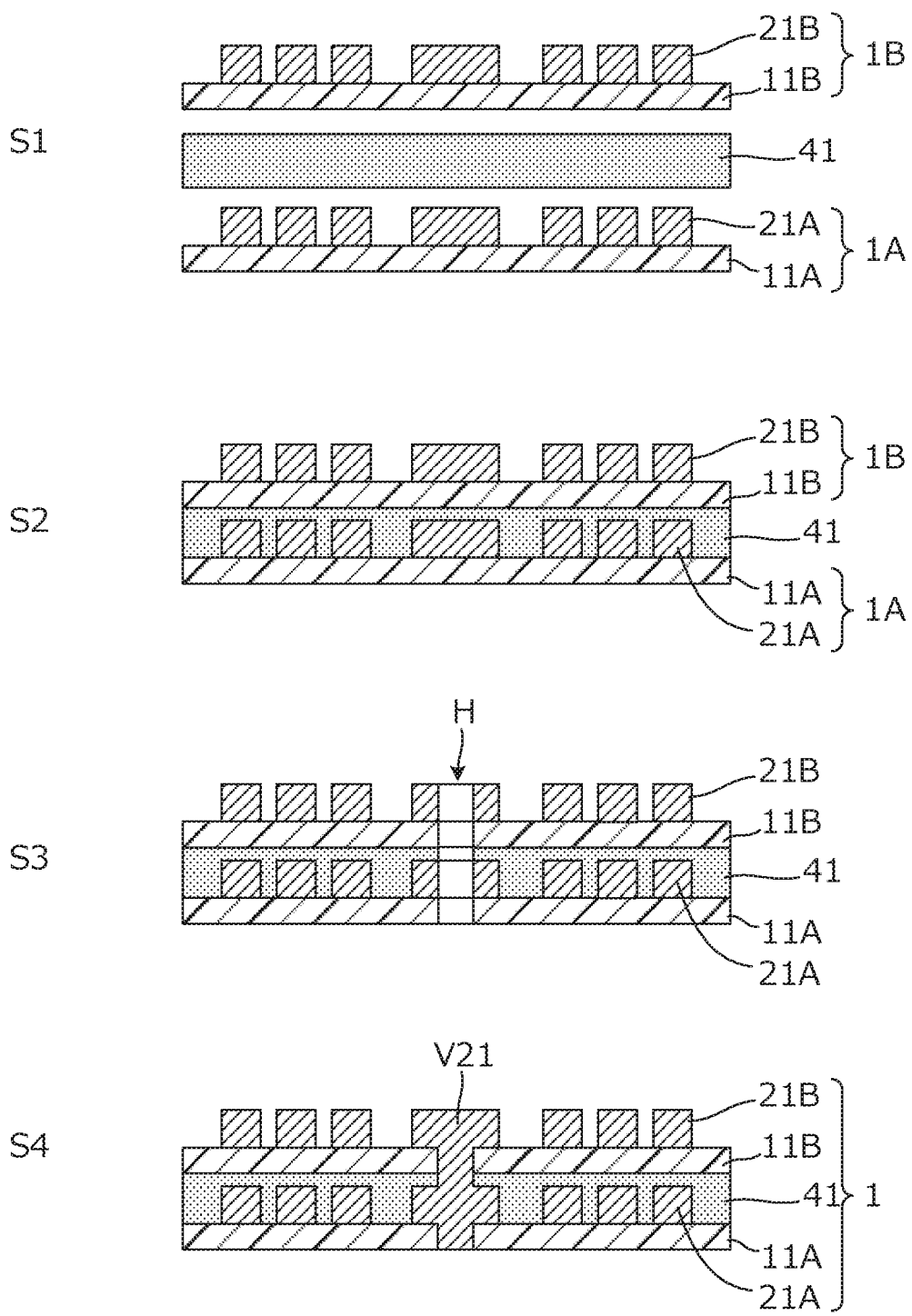
FIG. 4 shows sectional views illustrating manufacturing steps of a multilayer coil according to a second preferred embodiment of the present invention.

FIGS. 4 and 5 show sectional views illustrating manufacturing steps of a multilayer coil according to the second preferred embodiment.

The multilayer coil 102 according to the present preferred embodiment is manufactured by the following example method.

A first substrate 1A is preferably formed by, for example, placing a Cu film on a first insulating base material 11A of an FR-4 type and photolithographically patterning the Cu film.

Referring to step S1 in FIG. 4, the first substrate 1A and another first substrate 1B are arranged so that a surface of the first substrate 1A on which a first conductor pattern 21A is formed and a first insulating base material layer 11B of the first substrate 1B face each other. A thermosetting adhesive layer (adhesive) 41 is sandwiched between the first substrate 1A and the first substrate 1B to form a multilayer body. The first substrate 1B is formed similarly to the first substrate 1A. The first conductor pattern 21A and a first conductor pattern 21B on the first substrate 1B are each a spiral coil pattern.

The multilayer body is pressed and heated at, for example, about 280° C. Thus, referring to step S2 in FIG. 4, the two first substrates 1A and 1B are joined together with the thermosetting adhesive layer 41 interposed therebetween. This step corresponds to the "first step".

Next, referring to steps S3 and S4 in FIG. 4, a through hole H is formed in the multilayer body so that the first conductor pattern 21A formed on the first insulating base material layer 11A and the first conductor pattern 21B formed on the first insulating base material layer 11B are exposed. A Cu plating film, for example, is preferably formed on the exposed surfaces of the first conductor patterns 21A and 21B. Thus, the first conductor patterns 21A and 21B are electrically connected to each other by a via hole V21. This step corresponds to the "second step". Thus, a first substrate 1 is prepared. A second substrate 2 is prepared similarly to the first substrate 1.

Referring to step S5 in FIG. 5, the first substrate 1 and the second substrate 2 are arranged so that the surface of the first substrate 1 on which the first conductor pattern 21B is formed and the surface of the second substrate 2 on which a second conductor pattern 22B is formed to face each other. A joining layer 30 is sandwiched between the first substrate 1 and the second substrate 2 to form a multilayer body. The joining layer 30 is preferably made of, for example, a thermoplastic resin, such as liquid crystal polymer (LCP).

The multilayer body is pressed and heated at, for example, about 280° C. Thus, referring to step S6 in FIG. 5, the first substrate 1 and the second substrate 2 are joined together with only the joining layer 30 interposed therebetween.

Amounts of deformation of the first insulating base material layers 11A and 11B and second insulating base material layers 12A and 12B at the fusion temperature of the joining layer 30 are less than that of the joining layer 30.

The present preferred embodiment provides a coil component in which first and second conductor patterns are both formed as coil patterns disposed in two layers.

In the present preferred embodiment, the first and second conductor patterns are both formed as conductor patterns in a plurality of layers. However, the arrangement may instead be such that only the first or second conductor patterns are formed as conductor patterns in a plurality of layers.

Third Preferred Embodiment

Also in a third preferred embodiment of the present invention, each of first and second conductor patterns is defined by coil patterns in a plurality of layers.

Figure 6:
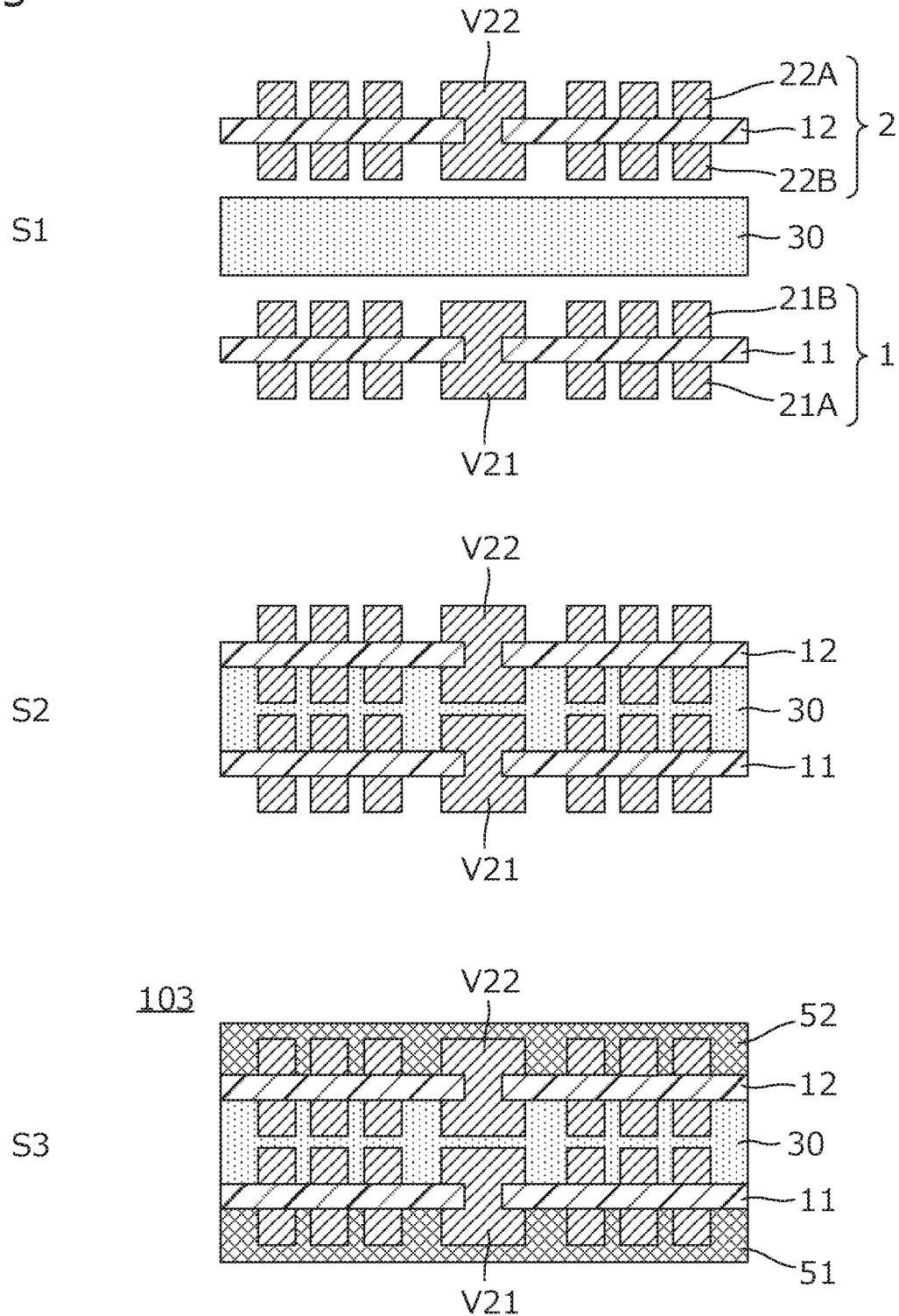
FIG. 6 shows sectional views illustrating manufacturing steps of a multilayer coil according to a third preferred embodiment of the present invention.

FIG. 6 shows sectional views illustrating manufacturing steps of a multilayer coil according to the third preferred embodiment.

The multilayer coil 103 according to the present preferred embodiment is manufactured by the following example method.

Referring to step S1 in FIG. 6, a substrate including a first insulating base material layer 11 and copper films formed on both sides thereof is prepared, and the copper films are patterned into first conductor patterns 21A and 21B. A via hole V21 is formed by a method described in the second preferred embodiment.

A first substrate 1 is prepared as described above, and a second substrate 2 is similarly prepared.

Referring to step S2 in FIG. 6, the first substrate 1 and the second substrate 2 are arranged so that the first conductor pattern 21B on the first substrate 1 and a second conductor pattern 22B on the second substrate 2 face each other, and a joining layer 30 is sandwiched between the first substrate 1 and the second substrate 2 to form a multilayer body. The joining layer 30 is preferably made of, for example, a thermoplastic resin, such as liquid crystal polymer (LCP).

The multilayer body is pressed and heated at, for example, about 280° C. Thus, referring to step S2 in FIG. 6, the first substrate 1 and the second substrate 2 are joined together with only the joining layer 30 interposed therebetween.

Then, referring to step S3 in FIG. 6, protective layers 51 and 52 are formed on the surfaces. For example, polyimide resin sheets are bonded to the surfaces. Alternatively, for example, epoxy resin is applied to the surfaces several times to form layers having a predetermined thickness. Since the protective layers 51 and 52 are formed on the surfaces of the multilayer body, materials having high fluidity may be used. Therefore, formation of voids is able to be reduced or prevented.

In the present preferred embodiment, the first and second conductor patterns are both formed as conductor patterns arranged on both sides of insulating base material layers. However, the arrangement may instead be such that only the first or second conductor patterns are formed as conductor patterns arranged on both sides of an insulating base material layer.

Fourth Preferred Embodiment

In a fourth preferred embodiment of the present invention, first and second conductor patterns are defined by a coil pattern disposed on both sides of insulating base material layers.

Figure 7:
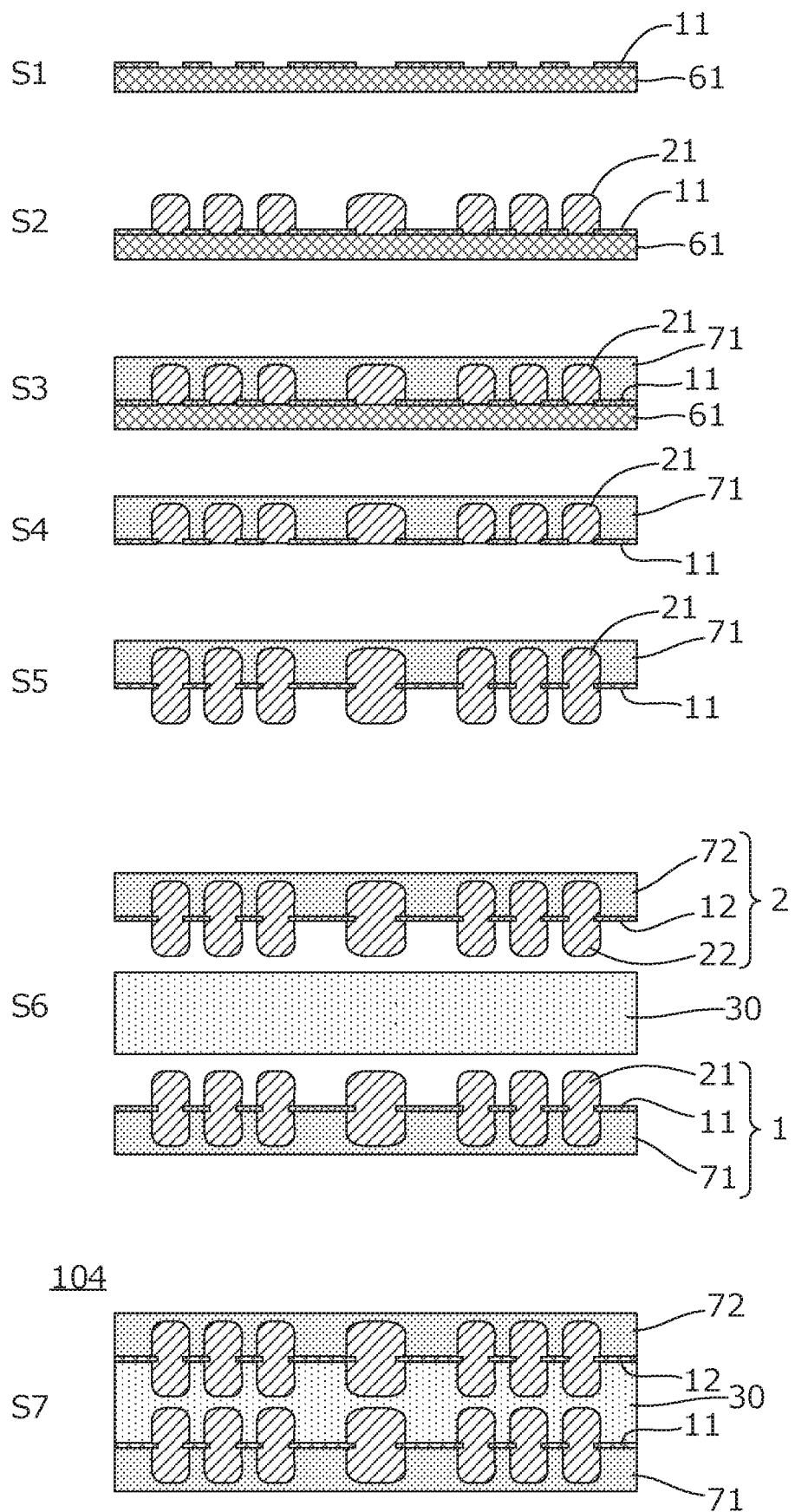
FIG. 7 shows sectional views illustrating manufacturing steps of a multilayer coil according to a fourth preferred embodiment of the present invention.
Figure 8:
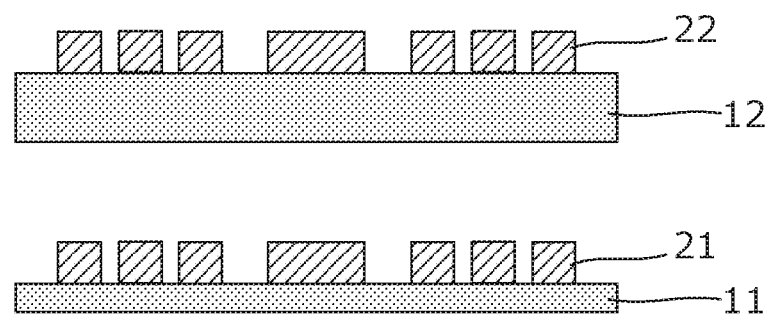
FIG. 8 is a sectional view of a multilayer coil having a first structure according to the related art before lamination.
Figure 9:
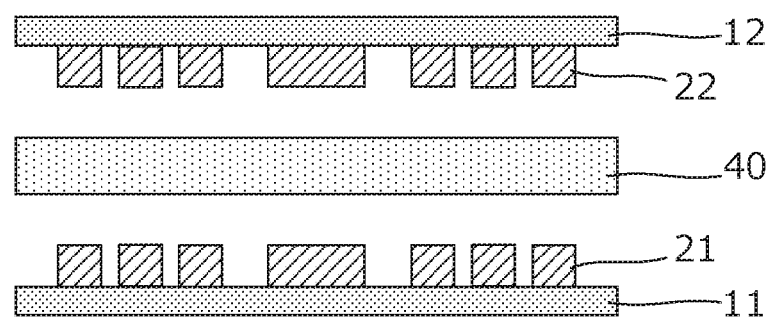
FIG. 9 is a sectional view of a multilayer coil having a second structure according to the related art before lamination.

FIG. 7 shows sectional views illustrating manufacturing steps of a multilayer coil according to the fourth preferred embodiment.

The multilayer coil 104 according to the present preferred embodiment is manufactured by the following example method.

Referring to step S1 in FIG. 7, a first insulating base material layer 11 defined by a resist layer is formed on a conductive support substrate 61 preferably made of, for example, Cu or Al, and is patterned.

Next, referring to step S2 in FIG. 7, an opening in the first insulating base material layer 11 is plated with Cu to form a first conductor pattern 21 defining a coil pattern.

Next, referring to step S3 in FIG. 7, a resin layer 71 that covers the first insulating base material layer 11 and the first conductor pattern 21 is formed on a surface of the support substrate 61. An amount of deformation of the resin layer 71 at the fusion temperature of a joining layer 30 is less than that of the joining layer 30.

Next, referring to steps S4 and S5 in FIG. 7, the support substrate 61 is removed and a Cu plating film is deposited on exposed portions of the first conductor pattern 21.

A first substrate 1 is prepared as described above, and a second substrate 2 is similarly prepared.

Referring to step S6 in FIG. 7, the first substrate 1 and the second substrate 2 are arranged so that an exposed surface of the first conductor pattern 21 on the first substrate 1 and an exposed surface of a second conductor pattern 22 on the second substrate 2 face each other. A joining layer 30 is sandwiched between the first substrate 1 and the second substrate 2 to form a multilayer body. The joining layer 30 is preferably made of, for example, a thermoplastic resin, such as liquid crystal polymer (LCP).

The multilayer body is pressed and heated at, for example, about 280° C. Thus, referring to step S7 in FIG. 7, the first substrate 1 and the second substrate 2 are joined together with only the joining layer 30 interposed therebetween.

Amounts of deformation of the resin layers 71 and 72 at the fusion temperature of the joining layer 30 are less than that of the joining layer 30.

The present preferred embodiment provides a coil component including a first conductor pattern having a thickness greater than that of the first insulating base material layer 11 and a second conductor pattern having a thickness greater than that of the second insulating base material layer 12.

In the present preferred embodiment, the first and second conductor patterns are both defined by a conductor pattern on both sides of insulating base material layers. However, the arrangement may instead be such that only the first or second conductor pattern is defined by a conductor pattern on both sides of an insulating base material layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer coil comprising:
    a first substrate including a first insulating base material layer and a first conductor pattern provided on the first insulating base material layer;
    a second substrate including a second insulating base material layer and a second conductor pattern provided on the second insulating base material layer;
    a joining layer that joins the first insulating base material layer and the second insulating base material layer together in a laminated state;
    a hole extending through the first insulating base material layer and the second insulating base material layer; and
    a conductor provided in the hole, and electrically connecting a portion of the first conductor pattern and a portion of the second conductor pattern to each other; wherein
    the joining layer is made of a thermoplastic resin;
    amounts of deformation of materials of the first insulating base material layer and the second insulating base material layer at a fusion temperature of the joining layer are less than an amount of deformation of the joining layer at the fusion temperature of the joining layer;
    the first conductor pattern and the second conductor pattern each include a coil pattern with a coil axis that extends in a lamination direction in which the first substrate and the second substrate are laminated together;

the joining layer is a single layer;

the multilayer coil includes a portion in which only the joining layer is interposed between the first conductor pattern and the second conductor pattern; and the conductor electrically connects only the portion of the first conductor pattern and the portion of the second conductor pattern to each other.

2. The multilayer coil according to claim 1, wherein at least one of the first conductor pattern and the second conductor pattern is a spiral coil.

3. The multilayer coil according to claim 1, wherein at least one of the first conductor pattern and the second conductor pattern is defined by a plated pattern.

4. The multilayer coil according to claim 1, wherein the first conductor pattern has a thickness greater than a thickness of the first insulating base material layer and the second conductor pattern has a thickness greater than a thickness of the second insulating base material layer, or the thickness of the first conductor pattern is greater than the thickness of the first insulating base material layer.

5. The multilayer coil according to claim 1, wherein at least one of the first conductor pattern and the second conductor pattern includes coil patterns in a plurality of layers.

6. The multilayer coil according to claim 1, wherein the first conductor pattern includes a coil pattern on both sides of the first insulating base material layer.

7. The multilayer coil according to claim 1, wherein the first conductor pattern and the second conductor pattern are made of a Cu film.

8. The multilayer coil according to claim 1, wherein the joining layer is made of liquid crystal polymer.

9. The multilayer coil according to claim 1, wherein the conductor provided in the hole is a Cu plating film.

* * * * *